(12) United States Patent
Flask et al.

(10) Patent No.: US 11,121,807 B2
(45) Date of Patent: Sep. 14, 2021

(54) METHODS AND SYSTEMS FOR DETERMINING STRESS ON A LOW DENSITY PARITY CHECK (LDPC) PROCESS FOR A NETWORK USING ORTHOGONAL FREQUENCY DIVISION MULTIPLEXING (OFDM)

(71) Applicant: Viavi Solutions Inc., San Jose, CA (US)

(72) Inventors: Robert Flask, San Jose, CA (US); Loren Eggert, San Jose, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 33 days.

(21) Appl. No.: 16/785,778

(22) Filed: Feb. 10, 2020

(65) Prior Publication Data

US 2021/0250122 A1 Aug. 12, 2021

(51) Int. Cl.
*H04L 1/00* (2006.01)
*H04L 5/00* (2006.01)

(52) U.S. Cl.
CPC .......... *H04L 1/0057* (2013.01); *H04L 5/0007* (2013.01)

(58) Field of Classification Search
CPC ............ H03M 13/6577; H03M 13/255; H04L 1/0057; H04L 5/0007
See application file for complete search history.

(56) References Cited

U.S. PATENT DOCUMENTS

2018/0175996 A1* 6/2018 Jia ...................... H04N 21/6118
2019/0075013 A1* 3/2019 Garcia ................ H04L 25/0202

* cited by examiner

Primary Examiner — Sung S Ahn
(74) Attorney, Agent, or Firm — DLA Piper LLP (US)

(57) ABSTRACT

A method, an apparatus and a system for determining stress on a low density parity check (LDPC) process for a network using orthogonal frequency division multiplexing (OFDM).

12 Claims, 5 Drawing Sheets

| DOCSIS CHECK - LDPC Stress Check | | | |
|---|---|---|---|
| A CWE Corr # | A CWE uncorr # | A LDPC Stress # Iter/CW | A LDPC Perf # % |
| B CWE Corr # | B CWE uncorr # | B LDPC Stress # Iter/CW | B LDPC Perf # % |

FIG. 4

METHODS AND SYSTEMS FOR DETERMINING STRESS ON A LOW DENSITY PARITY CHECK (LDPC) PROCESS FOR A NETWORK USING ORTHOGONAL FREQUENCY DIVISION MULTIPLEXING (OFDM)

BRIEF DESCRIPTION OF THE FIGURES

FIG. 4 shows an example of a user interface that may be displayed on the test instrument in accordance with the disclosed principles.

DETAILED DESCRIPTION OF SEVERAL EMBODIMENTS

Figure 1:
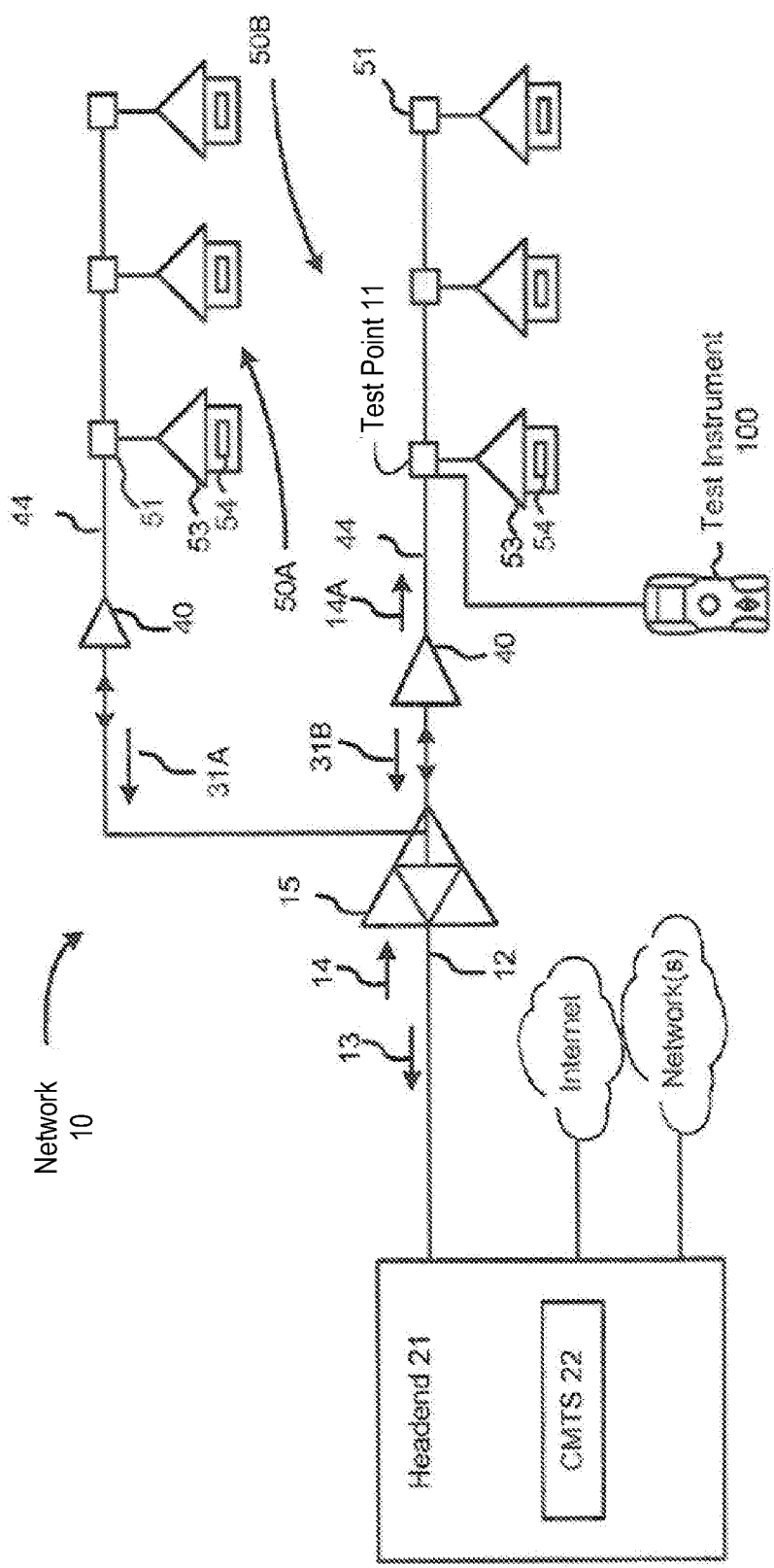
FIG. 1 shows an example of a network according to an example of the present disclosure.

Embodiments described herein may be configured to provide a method, apparatus and system for determining stress on a low density parity check (LDPC) process for a network using orthogonal frequency division multiplexing (OFDM). In one embodiment, a computer-implemented method comprises: inputting, at a test instrument connected to a channel of a network transmitting signals using orthogonal frequency division multiplexing (OFDM), data received from the signals transmitted over the network, the received data comprising at least one parameter associated with a low density parity check (LPDC) process performed by the network for a profile of the channel; and determining an LDPC stress level for the profile based on the at least one parameter.

In another embodiment, a test instrument configured to be connected to a channel of a network transmitting signals using orthogonal frequency division multiplexing (OFDM) is provided. The test instrument comprises a storage device and a processor executing program instructions stored in the storage device to: input data received from the signals transmitted over the network, the received data comprising at least one parameter associated with a low density parity check (LPDC) process performed by the network for a profile of the channel; and determine an LDPC stress level for the profile based on the at least one parameter.

On one or more embodiments, the at least one parameter comprises a number of received codewords on the profile and an LDPC iteration count for the profile and the LDPC stress level is determined as an average LDPC iteration count per received codeword.

Two-way hybrid fiber-coaxial (HFC) networks are shared bi-directional networks with point-to-multipoint transmission in the downstream direction, and multipoint-to-point transmission in the upstream direction. Signals are distributed via a fiber optic connection from a head-end to a node that converts the optical signal to an electrical signal, and then distributes the signals to residences via a tree and branch coaxial cable distribution network. At the subscriber side, terminal equipment supports the delivery of cable services (video, data and voice services) to subscribers, via cable modems. Data and voice services are supported by cable modems and communication gateways, respectively, which require the use of an upstream signal path. The network uses a fiber optic upstream signal path from the node to the head-end. A return band is used to support transmissions from devices at subscribers' premises back to the head-end. In such networks, many cable modems may compete for communication bandwidth in both the upstream and downstream directions.

A cable modem generally uses standardized communication protocol based on the Data over Cable System Interface Specification (DOCSIS) to access data services through the cable network, by using the downstream path to indicate exactly when each modem is permitted to transmit in the upstream direction. With the deployment of DOCSIS 3.1, field and maintenance technicians are faced with new challenges due to the use of newer technologies such as OFDM (Orthogonal Frequency Division Multiplexing) and modulation profiles that provide unprecedented flexibility and capability. Modulation is where OFDM makes significant improvements in network performance. Instead of using one modulation for the entire plant, OFDM can allow different modulations for each subcarrier. Profiles can be created that define what modulation is used on each subcarrier and multiple profiles can be created for this purpose.

Each profile may have its own modulation (for example, 64 QAM, 1024 QAM, 2048 QAM, or 4096 QAM). OFDM can use the profile that has the highest QAM that a subcarrier can handle for each portion of the HFC plant. In one part of the plant, this might be e.g., 4096 QAM. In another part, it might be e.g., 1024 QAM.

Operators can use DOCSIS 3.1 to utilize portions of the plant that previously could not carry traditional quadrature amplitude modulation (QAM) signals. Operators can also leverage DOCSIS 3.1 to gain additional capacity and efficiency to maximize their utilization of the existing plant. Knowing what to look for and how to evaluate DOCSIS 3.1 is critical for the field technician.

The advances made by OFDM would not be possible without some form of error correction. DOCSIS 3.1, for example, uses a low density parity check (LDPC) process as an error correction mechanism whereas DOCSIS 3.0 uses a forward error correction (FEC) scheme that relies on Reed-Solomon pre and post bit error ratios (BER). With the Reed-Solomon pre and post BER methodology used in DOCSIS 3.0 QAM carriers, a user could refer to either or both the pre and post BER values to predictiviely determine how close to the carrier was to having customer impacting data loss or failure. Due to the advancements attributable to OFDM, pre and post Reed-Solomon BER cannot be used for predictive data loss in a DOCSIS 3.1 system. The LDPC process, which is able to see across the entire bandwidth, looks for codeword errors instead of bit errors. For example, it is known in the art that a codeword is a data bucket within a DOCSIS packet and a codeword error is a byte-level data packet corruption resulting from QAM symbol displacement across constellation decision boundaries. If codeword errors are correctable, the LDPC process will automatically make adjustments to correct the codeword(s) so that higher modulations can be obtained. As is known in the art, this greatly reduces the need for retries and keeps subcarriers working at optimal levels.

Unfortunately, the LDPC process has a known downside. As the LDPC process makes real-time adjustments, it can reach its limits regarding power levels and modulation error ratio (MER) while trying to correct codewords. This means that the LDPC process gives the user less warning of impending failures. If the LDPC process goes over this edge, codewords may become uncorrectable and customer quality of experience (QoE) begins to decline (this may be referred to as the "cliff effect"). As can be appreciated, a decline in quality of experience (QoE) is undesirable. Accordingly, there is a need and desire to develop testing to prevent this from happening and provide early warnings to avoid the cliff effect.

The inventors have determined that because the LDPC process has a much wider range of operation, corrected codeword errors are not a good predictive indicator of network problems. For example, network personnel are often instructed that corrected codewords are acceptable and that modems may operate completely successfully with 100% of the higher profile codewords being corrected. The problem the disclosed principles seek to address is that there currently is no good way to determine how "deep" into the LDPC operating range a modem is operating, which may be useful for determining how close to the cliff effect the modem/network really is and therefore how close the modem/network is to experiencing uncorrectable errors and data loss.

Accordingly, there is a need and desire to determine whether the LDPC process is approaching the point where it can no longer correct codewords so that impending failures in the modem/network can be detected and prevented.

According to the disclosed principles, an LDPC stress metric representing how hard the LDPC process is working (hereinafter the "LDPC stress level") is determined. In one or more embodiments, the LDPC stress level may be determined on a per-profile basis. This novel LDPC stress level may provide an early warning on modem and or network performance before data loss occurs. The LDPC stress level may help differentiate a network experiencing high corrected codewords with plenty of margin (e.g., representing a network that is not on the brink of failure) from a network experiencing high corrected codewords and on the brink of uncorrectable errors.

In one embodiment, the LDPC stress level may be based in part on the number of LDPC iterations used during the error correction process. For example, it is known in the art that the LDCP process is an iterative process. For each codeword, the error correction layer iterates over the LDCP process until all corrections are made or the budget is exhausted (leaving uncorrected errors). The inventors have determined that the number of iterations required to correct the codewords is related to the number and or severity of the errors. As such, the inventors have determined that the iteration count may be used to gauge how hard the LDPC process is working. In addition, the LDPC stress level may be based in part on the number of received codewords such that the level may be determined as an average iteration count per codeword on a per profile basis.

FIG. 1 illustrates a network 10, according to an example of the present disclosure. In this network 10, a test instrument 100 may be used to measure and or input data such as total codewords received, corrected codewords, uncorrected codewords and LDPC iterations for one or more profiles as discussed herein. More specifically, the test instrument 100 may perform the per-profile LDPC stress level determination process (e.g., process 200 illustrated in FIG. 2) in accordance with the disclosed principles. In the illustrated example, the network 10 is a cable TV network, but the test instrument 100 may be used in other types of networks.

Network 10 may be a portion of a cable TV network that delivers cable TV signals, including digital TV signals and data and control signals, to end users at customer premises 53 in the downstream direction, and receives and forwards data and other signals from the customer premises 53 in the upstream direction. The network 10 may include a hybrid fiber coaxial network or other type of cable TV network. The network 10 includes a headend 21. Upstream signals are transmitted from the customer premises 53 to the headend 21, and downstream signals are transmitted from the headend 21 to the customer premises 53. The headend may include a cable modem termination system (CMTS) 22. The CMTS 22 may handle DOCSIS signals and an edge quadrature amplitude modulation (EQAM) for video signals and perform other functions known to be performed by headends in cable TV networks.

Downstream radio frequency (RF) signals 14 transmitted from the headend 21 may be distributed to a plurality of end-of-the-line subscribers or end users, for example, via one or more trunk coaxial cables 44 and subscriber taps 51. At the customer premises 53, the downstream signals may be demodulated using cable modems 54, which may be connected to customer premises equipment (not shown), such as wireless routers, set top boxes, smart televisions, personal computers, smartphones, etc.

Upstream RF signals may be transmitted from the customer premises 53 towards the headend 21. The first and second groups of customer premises 50A and 50B may send upstream signals 31A and 31B, respectively, which may be combined by the bidirectional amplifier 15 into the upstream RF signal 13 propagating towards the headend 21. In an example, the upstream RF signal 13 may be converted to an optical signal at a fiber node (not shown) between the customer premises 53 and the headend 21, and the fiber node transmits the upstream signal to the headend 31.

The network 10 may serve a large number of customer premises 50A and 50B, which may be connected by taps 51 to a plurality of trunks coaxial cables 44 at a plurality of different locations. The trunk coaxial cables 44 may be buried in the ground or they may be elevated above the ground on utility poles, or a combination of both. One or more two-way trunk RF amplifiers 40 may be provided in each of the trunk coaxial cables 44 to suitably amplify the upstream and downstream CATV signals on their way to and from the customer premises 53. In other examples, fiber cables may be run to the home and the test instrument 100 may connect to the fiber cables.

The headend 21 may include CMTS 22 and may control and setup data paths in the network 10. The CMTS 22 may support the DOCSIS MAC protocol and upper layer DOCSIS protocols. The CMTS may perform signaling functions, downstream and upstream bandwidth time slot scheduling, and DOCSIS framing. The CMTS 22 or other circuits in the headend 21 may provide video processing functions. The headend 21 may send and receive video and data via the Internet or via other networks 36.

The test instrument 100 may be connected to the network 10 at any desired test point to measure signals transmitted in the network 10. For example, the test instrument 100 is shown as connected to test point 11. The test instrument 100, however, may be connected at any location where connections are available to connect to the network 10. The test points may include test points having access to upstream channels in the network 10, such as a location in the network 10 between the headend 21 and a customer premises 53. The test instrument 100 may be connected to the network 10 via a test access point (tap).

The test instrument 100 may include one or more ports to connect to the test point 11. In an example embodiment, the port(s) may include coaxial RF cable connectors. It will be appreciated that test instrument 100 may also have other non-cable ports, for example, to connect to a computer or to an external display, such as, but not exclusively, one or more USB ports and the like. The test instrument 100 may receive upstream channels in the network 10 and measure and or input data such as total codewords received, corrected codewords, uncorrected codewords and LDPC iterations for one or more profiles in accordance with the disclosed principles (discussed below).

FIG. 1 depicts the network 10. It should be appreciated that the network 10 may represent a portion of a cable plant. The cable plant may have multiple fiber nodes and multiple branches between the headend 21 and the customer premises 53.

Figure 2:
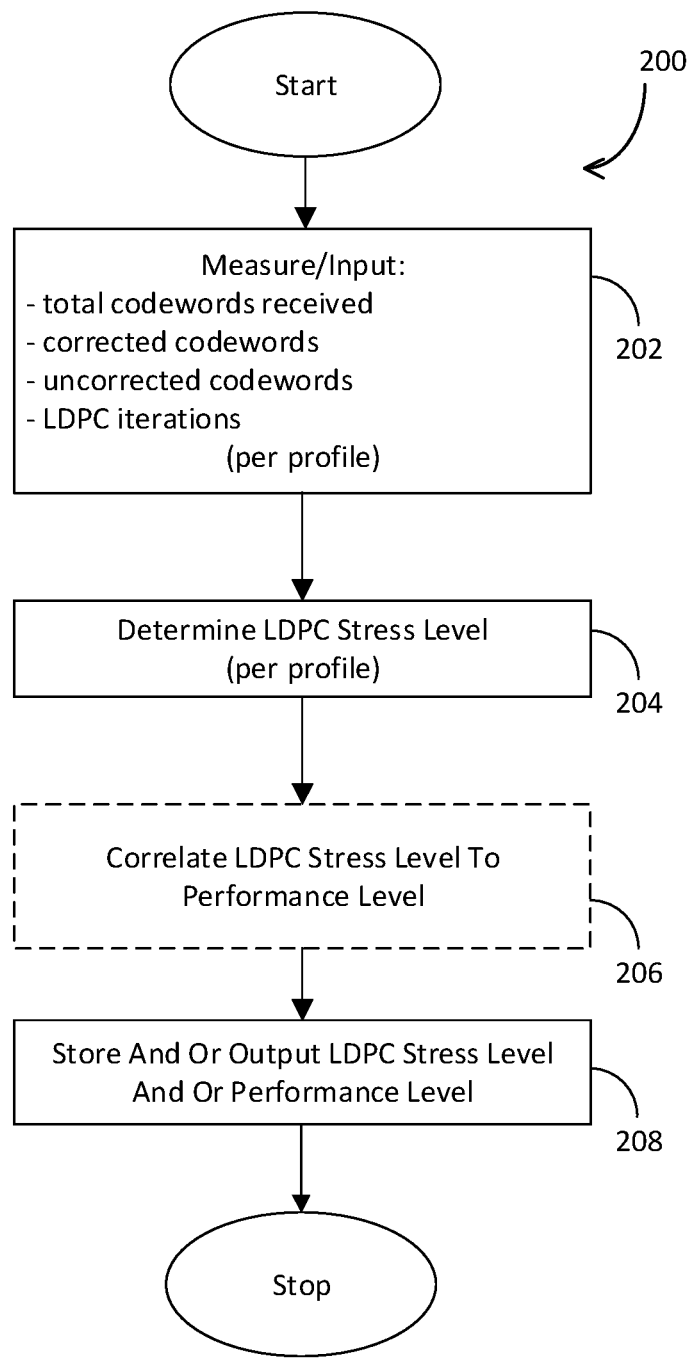
FIG. 2 shows an example per-profile LDPC stress level determination process performed in accordance with the principles disclosed herein.

FIG. 2 shows an example per-profile LDPC stress level determination process 200 performed in accordance with the principles disclosed herein. In one embodiment, the process 200 may be performed by a test instrument such as e.g., the OneExpert CATV line of analysis meters manufactured and sold by VIAVI Solutions Inc. In one embodiment, the method 200 may be performed as part of a "DOCSIS Check" function, a "LDPC Stress Check" or a channel analysis function of the test instrument.

The method 200 begins at step 202 where the test instrument may measure and or input data required to determine one or more LDPC stress level values in accordance with the disclosed principles. In one embodiment, this data may include total codewords received, corrected codewords, uncorrected codewords and LDPC iterations for one or more profiles of interest.

In one embodiment, one or more profiles of interest may be determined by a user via the selection of an appropriate function key and/or menu displayed on the test instrument. For example, in one embodiment, the test instrument could have a dedicated function key, or other key/button, for activating the method 200 (e.g., a key labeled "DOCSIS Check", "LDPC Stress Check"). In one or more embodiments, the test instrument could have a key or keys for setting associated parameters for the process 200 (e.g., a mechanism for selecting one or more profiles). A processor or other control circuit internal to the test instrument may perform step 202 upon receipt of the appropriate activation selection.

At step 204, the process 200 may determine the value of the LDPC stress level for the one or more profiles of interest based on the data input at step 202. In one embodiment, the LDPC stress level is the average LDPC iterations per received codeword and may be computed as shown below in Equation:

LDPC stress level=LDPC iteration count/total codewords received    (1)

Although not required to determine the LDPC stress level, the process 200 may also determine the ratio of the corrected codewords to total received codewords and or the ratio of the uncorrected codewords to total received codewords. These ratios may provide additional information about network performance for the one or more profiles.

At step 206 the process 200 may correlate the determined LDPC stress level, which is in units of average LDPC iterations per codeword, to another value (referred to herein as a performance level) that may provide a better indication of an impending failure on the profiles of interest. This is an optional step as shown by the dashed lines in FIG. 2. In one embodiment, the performance level may be determined based on the modem's maximum number of LDPC iterations per codeword. For example, the performance level may be determined by dividing the determined LDPC stress level by the modem's maximum number of LDPC iterations per codeword and multiplying this value by 100 to represent the percentage of how hard the LDPC is working and thus how imminent a failure is. For example, if the modem's maximum number of LDPC iterations per codeword is 20, and the determined stress level is 3.5, the performance level would be 3.5/20*100 or 17.5%. The user may be informed of the performance level in addition to or as an alternative to the LDPC stress level of 3.5 iterations/codeword.

In one or more embodiments, instead of outputting the performance level as a percentage, the performance level may be normalized to create a value within a scaled range of e.g., 0 to 10. In these embodiments, a 0 may mean that the profile is working as best as can be expected and a 10 may indicate a failure. The other values in the scale may provide the network, maintenance and or other personnel with a gauge on how close the system is to a failure.

At step 208, the process 200 may cause the determined LDPC stress level and or performance level to be output to a display of the test instrument. In one or more embodiments, the process 200 may cause the determined LDPC stress level and or performance level to be stored in a memory of the test instrument.

As can be appreciated, by determining a per-profile LDPC stress level, the process 200 and the disclosed principles provide visibility into the operational range of the LDPC process that does not currently exist in the technological field. Moreover, this visibility provides the user (e.g., network, maintenance and or other personnel) with the ability to prevent failures in a simple, yet robust manner, allowing corrective measures to be taken before a failure occurs—something that also does not currently exist in the technological field. These are major improvements in the technological field as they provide critical functionality currently not available in the art that solves a known problem (i.e., unawareness of the cliff effect) in the art.

Figure 3:
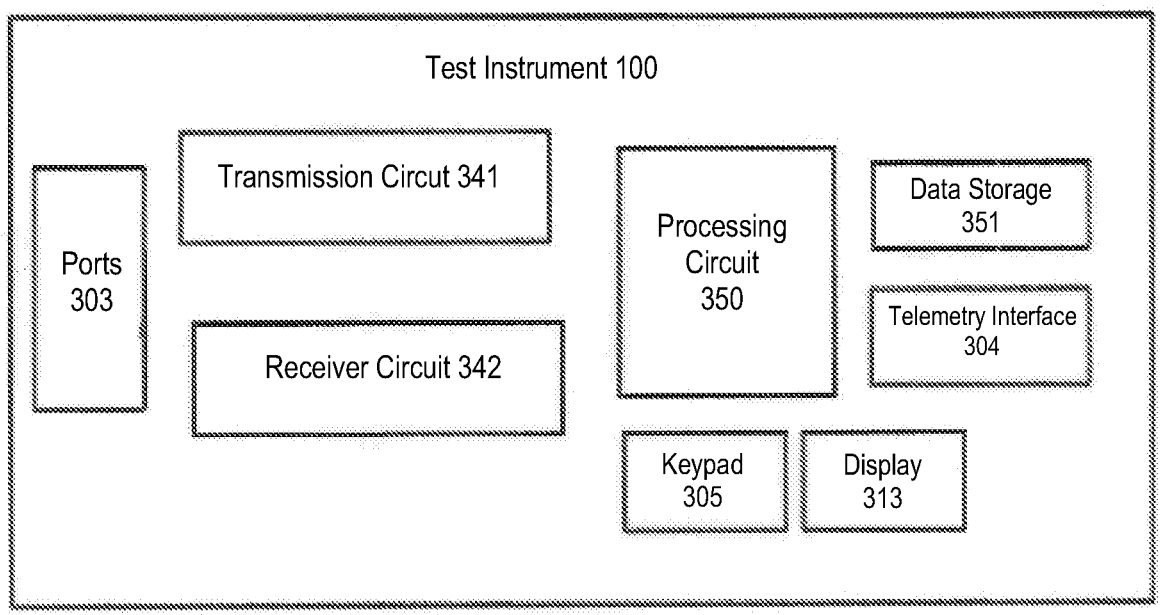
FIG. 3 shows an example of a test instrument that may perform the per-profile LDPC stress level determination process of FIG. 2 in accordance with the principles disclosed herein.

FIG. 3 shows a high-level block diagram of the test instrument 100, according to an example embodiment. It should be appreciated that the test instrument 100 may include components other than those shown. The test instrument 100 may include one or more ports 303 for connecting the test instrument 100 to a test point, such as the test point 11 shown in FIG. 1. The one or more ports 303 may include connectors for connecting to cables in the network 10 carrying traffic for upstream and downstream channels. The traffic may include video, voice and data packets, etc. The test instrument 100 may include a telemetry interface 304 for connecting to a telemetry channel, such as a WiFi interface, Bluetooth interface, cellular interface or another network interface. The test instrument 100 may connect to a remote device via the telemetry interface 304.

The test instrument 100 includes a user interface which may include a keypad 305 and display 313. The display 313 may include a touch screen display. A user may interact with the test instrument 100, such as to enter information, select operations, view measurements, view interference profiles, etc., via the user interface.

A data storage 351 may store any information used by the test instrument 100 and may include memory or another type of known data storage device. The data storage 351 may store total codewords received, corrected codewords, uncorrected codewords and LDPC iterations for one or more profiles of interest and/or any other measurements or data used by the test instrument 100. In addition, the data storage 351 may store calculated LDPC stress level values and or profile level values determined in accordance with the disclosed principles. In one embodiment, this data may include The data storage 351 may include a non-transitory computer readable medium storing machine-readable instructions executable by processing circuit 350 to perform operations of the test instrument 100 such as those described for process 200.

Transmission circuit 341 may include a circuit for sending test signals upstream to perform various tests, such as frequency sweep tests. The transmission circuit 341 may include encoders, modulators, and other known component for transmitting signals in the network 10. Receiver circuit 342 may include components for receiving signals from the network 10. The components may include components such as a demodulator, decoder, analog-to-digital converters, and other known components suitable for a receiver circuit.

Processing circuit 350 may include any suitable hardware to perform the operations of the test instrument 100 described herein, including the operations described with respect to FIG. 2 and the methods described herein. The operations include measuring and testing operations, including determining signal parameters for upstream and downstream signals transmitted in the network 10 and performing the per-profile LDPC stress level determination process 200 described above. The hardware of the test instrument 100, including the processing circuit 350, may include a hardware processor, microcontroller, a digital signal processor (DSP), an application specific integrated circuit (ASIC), a field programmable gate array (FPGA) or other programmable logic device, discrete gate or transistor logic, discrete hardware components, or any combination thereof designed to perform the functions and methods described herein. In an example, one or more of the functions and operations of the test instrument 100 described herein may be performed by the processing circuit 350 or other hardware executing machine readable instructions stored in a non-transitory computer readable medium, which may comprise RAM (random access memory), ROM (read only memory), EPROM (erasable, programmable ROM), EEPROM (electrically erasable, programmable ROM), hard drives, flash memory, or other types of storage devices, which may be volatile and/or nonvolatile.

In an example, a technician wishing to test the downstream path at the test point 11 may connect the test instrument 100 to the test point 11 via the one or more ports 303. The technician may select a "DOCSIS Check" or "LDPC Stress Check" function via the keypad 305 to initiate the process 200 disclosed herein. The test instrument 100 may receive signals via the test point 11 and generate per-profile LDPC stress level determinations in accordance with the disclosed principles for the channel, which may be presented on the display 313.

FIG. 4 shows an example of a user interface 400 that may be displayed on the display 313 of the test instrument 100 in accordance with the disclosed principles. In the illustrated example, it is presumed that the user has navigated the appropriate function keys, menu items and or soft keys to a DOCSIS Check and or LDPC Stress Check function as indicated by field 402. In the illustrated example, the user interface 400 includes information fields 404, 406, 408, 410 associated with a first profile of interest (e.g., profile A) and information fields 414, 416, 418, 420 associated with a second profile of interest (e.g., profile B).

In the illustrated example, field 404 includes the number of corrected codeword errors for profile A, field 406 includes the number of uncorrected codeword errors for profile A, field 408 includes the LDPC stress level for profile A and field 410 includes the LDPC performance level for profile A. In addition, field 414 includes the number of corrected codeword errors for profile B, field 416 includes the number of uncorrected codeword errors for profile B, field 418 includes the LDPC stress level for profile B and field 420 includes the LDPC performance level for profile B.

In one example, the LDPC stress levels shown in fields 408, 418 may be presented in units of average LDPC iterations per codeword as discussed above with respect to FIG. 2. In the illustrated example, the LDPC performance levels shown in fields 410, 420 may be presented as a percentage based on the modem's maximum number of LDPC iterations per codeword as discussed above with respect to FIG. 2. Although not shown in FIG. 4, the LDPC performance levels shown in fields 410, 420 may be presented as a number in a scale of e.g., 0 to 10 as discussed above with respect to FIG. 2.

Figure 5:
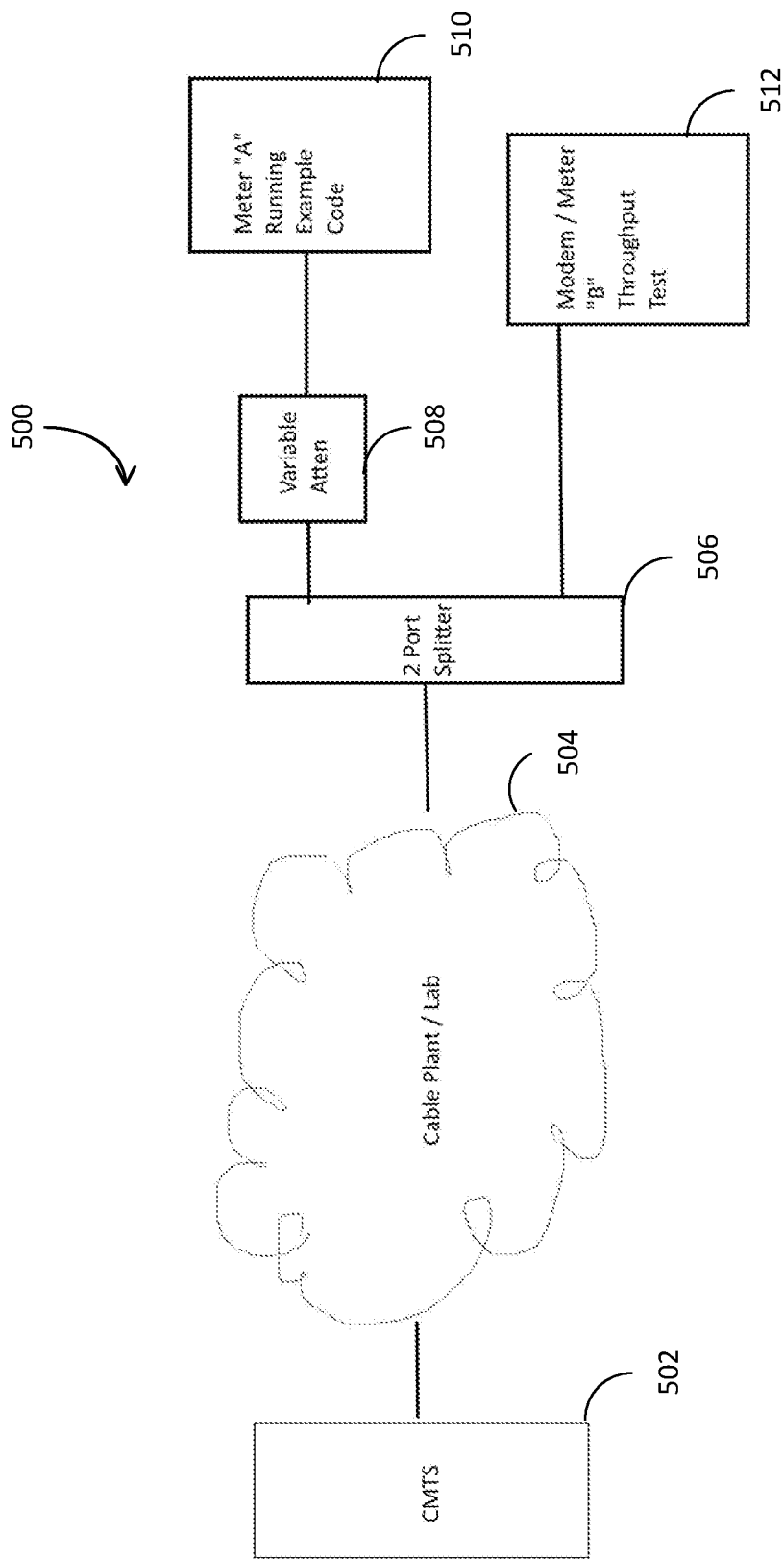
FIG. 5 shows a test setup used to test the disclosed principles.

FIG. 5 shows a test setup 500 that was used to test the disclosed principles. The setup 500 consisted of a CMTS 502, cable plant/lab network connection 504, two-port splitter 506, variable attenuator 508, and two test instruments/meters 510, 512. In the test setup 500, the first test instrument/meter 510 was programmed to perform a portion of process 200 (e.g., determining the LDPC stress level by inputting total codewords received, corrected codewords, uncorrected codewords and LDPC iterations for a profile of interest). In addition, the first test instrument 510 was programmed (e.g., using test code) to output specific data to provide an indication of the test results.

In addition, the second test instrument/meter 512 was enabled to run a throughput test so that there would be data modulated on the profile of interest, allowing the first test instrument/meter 510 to input and analyze the data as discussed herein. It should be appreciated that under normal operation of a CATV network, the second test instrument/meter 512 would not be required as the modems connected to the network would provide the necessary data for the first test instrument/meter 510 to perform the process 200 disclosed herein.

While second test instrument/meter 512 was running a throughput test, the first test instrument/meter 510 executed the test code to generate baseline statistics shown below in Table 1. In the illustrated test setup 500, total codewords, correctable codewords, uncorrectable codewords, and the LDPC iteration count are output from a programmable codeword statistics block in the cable modem used in the CMTS 500. The testing cycles through each profile, configures the programmable statistics to measure the profile of interest, dwells for 1 second, and then prints out the results. In this example, the outputs include the profile identification (e.g., 0, 1, 2), total codewords received (shown as "TOTAL"), corrected codewords (shown as "CORR"), uncorrected codewords (shown as "UNCORR"), LDPC iterations (shown as "LDPC ITERS"), ratio of the corrected codewords to total codewords (shown as "CorCER"), ratio of the uncorrected codewords to total codewords (shown as "UncorCER"), and average LDPC iterations per received codeword (shown as "Iter/CW").

From the baseline results, it was observed that the vast majority of data was being carried over profile 2 and that 100% of the codewords were corrected. Moreover, it was observed that there was an average of approximately 3.5 LDPC iterations per profile 2 codeword, which in one embodiment may be the LDPC stress level discussed above with respect to process 200.

TABLE 1

| Printing stats for profile 0 |
| --- |
| TOTAL = 1230 |
| CORR = 0 |
| UNCORR = 0 |
| LDPC ITERS = 0 |
| CorCER = 0.000000 |
| UncorCER = 0.000000 |
| Iter/CW = 0.000000 |
| Printing stats for profile 1 |
| TOTAL = 8 |
| CORR = 2 |
| UNCORR = 0 |
| LDPC ITERS = 2 |
| CorCER = 0.250000 |
| UncorCER = 0.000000 |
| Iter/CW = 0.250000 |
| Printing stats for profile 2 |
| TOTAL = 28346 |
| CORR = 28346 |
| UNCORR = 0 |
| LDPC ITERS = 100594 |
| CorCER = 1.000000 |
| UncorCER = 0.000000 |
| Iter/CW = 3.548790 |

Once the baseline was determined, the signal was attenuated 5 dB (via attenuator 508) to reduce the signal to noise ratio. The throughput test was repeated via the second test instrument/meter 512 and the first test instrument/meter 510 executed the test code to generate new statistics shown below in Table 2.

TABLE 2

| Printing stats for profile 0 |
| --- |
| TOTAL = 942 |
| CORR = 0 |
| UNCORR = 0 |
| LDPC ITERS = 0 |
| CorCER = 0.000000 |
| UncorCER = 0.000000 |
| Iter/CW = 0.000000 |
| Printing stats for profile 1 |
| TOTAL = 8 |
| CORR = 7 |
| UNCORR = 0 |
| LDPC ITERS = 7 |
| CorCER = 0.875000 |
| UncorCER = 0.000000 |
| Iter/CW = 0.875000 |
| Printing stats for profile 2 |
| TOTAL = 26536 |
| CORR = 26536 |
| UNCORR = 0 |
| LDPC ITERS = 264343 |
| CorCER = 1.000000 |
| UncorCER = 0.000000 |
| Iter/CW = 9.961675 |

Repeating the throughput test and the data capture described above, it was observed that profile 2 is still carrying the majority of the data and still has 100% corrected codewords, However, unlike the baseline statistics, the average LDPC iterations per codeword jumped up to approximately 9.96. This indicates that the LDPC layer is working much harder to correct the errors (i.e., the LDPC stress level has increased). Thus, this example illustrates how the disclosed principles provide additional visibility into the error correction performance for the OFDM network—something that current networks and test instruments are not capable of doing.

The illustrated example was repeated until uncorrectable codewords were achieved. As shown below in Table 3, for profile 2, the LDPC iteration count skyrocketed to 441,416 and the iteration limit was exhausted before all errors can be corrected (i.e., there were 628 uncorrected codewords). In the illustrated example, the average LDPC iterations per codeword was over 15 when failures occurred.

TABLE 3

| Printing stats for profile 0 |
| --- |
| TOTAL = 1221 |
| CORR = 0 |
| UNCORR = 0 |
| LDPC ITERS = 0 |
| CorCER = 0.000000 |
| UncorCER = 0.000000 |
| Iter/CW = 0.000000 |
| Printing stats for profile 1 |
| TOTAL = 8 |
| CORR = 8 |
| UNCORR = 0 |
| LDPC ITERS = 8 |
| CorCER = 1.000000 |
| UncorCER = 0.000000 |
| Iter/CW = 1.000000 |
| Printing stats for profile 2 |
| TOTAL = 28473 |
| CORR = 27845 |
| UNCORR = 628 |
| LDPC ITERS = 441416 |
| CorCER = 0.977944 |
| UncorCER = 0.022056 |
| Iter/CW = 15.502968 |

The apparatus, system and method for determining and using per-profile LDPC stress level determination disclosed herein provides numerous advantages over the current state of the art. For example, the disclosed principles provide visibility into the operational range of the LDPC process that does not currently exist in the technological field. Moreover, this visibility provides the user (e.g., network, maintenance and or other personnel) with the ability to prevent failures in a simple, yet robust manner, allowing corrective measures to be taken before a failure occurs—something that also does not currently exist in the technological field. These are major improvements in the technological field as they provide critical functionality currently not available in the art that solves a known problem (i.e., unawareness of the cliff effect) in the art.

In addition, no additional hardware is needed carry out the process 200 disclosed herein—i.e., no additional hardware is required to determine, use, output and or store the per-profile LDPC stress levels disclosed herein. Thus, in one embodiment, the process 200 may be ported to pre-existing test instruments as part of a software upgrade. This means that the disclosed principles may be deployed on tens of thousands of test instruments that are already deployed in the field.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s)

how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A computer-implemented method comprising:
   inputting, at a test instrument connected to a channel of a network transmitting signals using orthogonal frequency division multiplexing (OFDM), data received from the signals transmitted over the network, the received data comprising at least one parameter associated with a low density parity check (LDPC) process performed by the network for a profile of the channel; and
   determining an LDPC stress level for the profile based on the at least one parameter,
   wherein the at least one parameter comprises a number of received codewords on the profile and an LDPC iteration count for the profile and the LDPC stress level is determined an average LDPC iteration count per received codeword.

2. The method of claim 1 further comprising outputting the determined LDPC stress level on a display of the test instrument.

3. The method of claim 1, further comprising determining an LDPC performance level based on the determined LDPC stress level.

4. The method of claim 3, wherein the at least one parameter comprises a maximum number of LDPC iterations per codeword, and determining the LDPC performance level comprises determining a ratio of determined the LDPC stress level to the maximum number of LDPC iterations per codeword.

5. The method of claim 3, wherein the at least one parameter comprises a maximum number of LDPC iterations per codeword, and determining the LDPC performance level comprises normalizing the determined the LDPC stress level to a scaled range based on the maximum number of LDPC iterations per codeword.

6. The method of claim 3 further comprising outputting the determined LDPC performance level on a display of the test instrument.

7. A test instrument configured to be connected to a channel of a network transmitting signals using orthogonal frequency division multiplexing (OFDM), said test instrument comprising:
   a storage device; and
   a processor executing program instructions stored in the storage device to:
      input data received from the signals transmitted over the network, the received data comprising at least one parameter associated with a low density parity check (LPDC) process performed by the network for a profile of the channel; and
      determine an LDPC stress level for the profile based on the at least one parameter,
   wherein the at least one parameter comprises a number of received codewords on the profile and an LDPC iteration count for the profile and the LDPC stress level is determined an average LDPC iteration count per received codeword.

8. The test instrument of claim 7, further comprising a display, wherein the processor executes instructions to output the determined LDPC stress level on a display of the test instrument.

9. The test instrument of claim 7, wherein the processor executes instructions to determine an LDPC performance level based on the determined LDPC stress level.

10. The test instrument of claim 9, wherein the at least one parameter comprises a maximum number of LDPC iterations per codeword, and determining the LDPC performance level comprises determining a ratio of determined the LDPC stress level to the maximum number of LDPC iterations per codeword.

11. The test instrument of claim 9, wherein the at least one parameter comprises a maximum number of LDPC iterations per codeword, and determining the LDPC performance level comprises normalizing the determined the LDPC stress level to a scaled range based on the maximum number of LDPC iterations per codeword.

12. The test instrument of claim 9, further comprising a display, wherein the processor executes instructions to output the determined LDPC performance level on a display of the test instrument.

* * * * *